(12) United States Patent
Mori et al.

(10) Patent No.: US 11,555,255 B2
(45) Date of Patent: Jan. 17, 2023

(54) TANTALUM CARBIDE COATED CARBON MATERIAL, MANUFACTURING METHOD THEREOF, AND MEMBER FOR APPARATUS FOR MANUFACTURING SEMICONDUCTOR SINGLE CRYSTAL

(71) Applicant: Shin-Etsu Chemical Co., Ltd., Tokyo (JP)

(72) Inventors: Chikara Mori, Gunma (JP); Waichi Yamamura, Annaka (JP); Shoji Kano, Gunma (JP); Akihiro Hirate, Gunma (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 2 days.

(21) Appl. No.: 17/149,733

(22) Filed: Jan. 15, 2021

(65) Prior Publication Data

US 2021/0140067 A1    May 13, 2021

Related U.S. Application Data

(62) Division of application No. 16/208,482, filed on Dec. 3, 2018, now abandoned.

(30) Foreign Application Priority Data

Dec. 4, 2017  (JP) .............................. JP2017-232383
Oct. 10, 2018 (JP) .............................. JP2018-191578

(51) Int. Cl.
*C30B 25/08*    (2006.01)
*C30B 29/36*    (2006.01)
(Continued)

(52) U.S. Cl.
CPC ............ *C30B 29/36* (2013.01); *C04B 41/009* (2013.01); *C04B 41/5057* (2013.01);
(Continued)

(58) Field of Classification Search
CPC ...... C04B 41/5057; C30B 25/08; C30B 25/12
(Continued)

(56) References Cited

U.S. PATENT DOCUMENTS

2012/0040172 A1   2/2012  Fujiwara et al.
2012/0301723 A1  11/2012  Kondo
2019/0185995 A1   6/2019  Jo

FOREIGN PATENT DOCUMENTS

CN   205152327 U   4/2016
JP   S63134663 A   6/1988
(Continued)

OTHER PUBLICATIONS

Office Action in JP Application No. 2018-191578, dated Aug. 24, 2021, 10pp.
(Continued)

*Primary Examiner* — Archene A Turner
(74) *Attorney, Agent, or Firm* — Hauptman Ham, LLP

(57) ABSTRACT

A member for an apparatus for manufacturing a semiconductor single crystal having long product life and a tantalum carbide coated carbon material are provided. The tantalum carbide coated carbon material according to the present invention is a tantalum carbide coated carbon material in which at least a part of a surface of a carbon base material is coated with a tantalum carbide coated film containing tantalum carbide as a main component, in which the tantalum carbide coated film, an intensity of an X-ray diffraction line corresponding to a plane with respect to an out-of-plane direction is larger than intensities of X-ray diffraction lines corresponding to other crystal planes, and the intensity ratio is 60% or more with respect to a sum of intensities of X-ray diffraction lines corresponding to all crystal planes.

5 Claims, 8 Drawing Sheets

(51) Int. Cl.

| | |
|---|---|
| *C04B 41/00* | (2006.01) |
| *C04B 41/87* | (2006.01) |
| *C30B 23/00* | (2006.01) |
| *C30B 25/12* | (2006.01) |
| *C04B 41/50* | (2006.01) |
| *C23C 16/32* | (2006.01) |
| *C23C 16/56* | (2006.01) |

(52) U.S. Cl.
CPC .............. *C04B 41/87* (2013.01); *C23C 16/32* (2013.01); *C23C 16/56* (2013.01); *C30B 23/00* (2013.01); *C30B 25/08* (2013.01); *C30B 25/12* (2013.01)

(58) Field of Classification Search
USPC ........................................................ 428/698
See application file for complete search history.

(56) References Cited

FOREIGN PATENT DOCUMENTS

| | | |
|---|---|---|
| JP | H11116398 A | 4/1999 |
| JP | 2005225710 A | 8/2005 |
| JP | 2008308701 A | 12/2008 |
| JP | 2018-075075 * | 4/2017 |
| WO | 2017024535 A1 | 11/2017 |

OTHER PUBLICATIONS

Long et al., "The effect of deposition temperature on the microstructure and mechanical properties of TaC coatings", Materials Letters 121, 2014, p. 202-205, 4pp.

Zhao-Ke et al., "Texture structure and ablation behavior of TaC coating on carbon/carbon composites", Applied Surface Science 257, 2010 p. 656-661, 6pp.

* cited by examiner

TANTALUM CARBIDE COATED CARBON MATERIAL, MANUFACTURING METHOD THEREOF, AND MEMBER FOR APPARATUS FOR MANUFACTURING SEMICONDUCTOR SINGLE CRYSTAL

CROSS-REFERENCE TO RELATED APPLICATION

This application is a divisional of U.S. patent application Ser. No. 16/208,482 filed on Dec. 3, 2018 and claims priority from Japanese Patent Application No. 2017-232383, filed on Dec. 4, 2017, and Japanese Patent Application No. 2018-191578, filed on Oct. 10, 2018, the entire contents of which are incorporated herein by reference.

BACKGROUND

Technical Field

The present invention relates to a tantalum carbide coated carbon material in which a surface of a carbon base material is coated with a tantalum carbide film, and a member for an apparatus for manufacturing a semiconductor single crystal using the material.

Background Art

Tantalum carbide has the highest melting point (about 3900° C.) among transition metal carbides, and is also excellent in chemical stability, strength, toughness, and corrosion resistance. Therefore, a tantalum carbide coated carbon material in which a surface of a carbon base material is coated with a tantalum carbide film is used as a member for an apparatus for manufacturing a semiconductor single crystal of silicon (Si), silicon carbide (SiC), gallium nitride (GaN) or the like.

As a method for manufacturing a bulk single crystal of SiC, a sublimation recrystallization method (modified Rayleigh method) is widely known. In the sublimation recrystallization method, a SiC raw material is filled in a crucible, and a SiC seed crystal is disposed on an upper portion thereof. In addition, a tubular guide member is installed around the SiC seed crystal. Sublimation gas generated by heating the SiC material rises along an inner wall of the guide member, and a SiC single crystal grows from the SiC seed crystal.

Further, a SiC single crystal substrate used for a semiconductor device or the like is manufactured by epitaxially growing a SiC single crystal on a SiC substrate composed of a bulk single crystal. As a method for epitaxially growing a SiC single crystal, a liquid phase epitaxy (LPE) method, a vapor phase epitaxy (VPE) method, a chemical vapor deposition (CVD) method, and the like are known. In general, the method for epitaxially growing a SiC single crystal is a CVD method. According to the epitaxial growth method by the CVD method, a SiC substrate is mounted on a susceptor in an apparatus and a raw material gas is supplied at a high temperature of 1500° C. or higher, so the SiC single crystal is grown.

In such a method for manufacturing a SiC single crystal, in order to obtain a higher-quality crystal, JP 11-116398 A discloses a method for using a crucible in which an inner surface of a graphite base material is coated with tantalum carbide. In addition, JP 2005-225710 A discloses a method using a guide member whose inner wall is coated with tantalum carbide.

In addition, attempts have been made to improve characteristics of a tantalum carbide coated film composed of the tantalum carbide coated carbon material by controlling orientation of the tantalum carbide coated carbon material. For example, JP 2008-308701 A discloses improvement in corrosion resistance and thermal shock resistance by specifically developing a (220) plane of tantalum carbide with respect to other crystal planes.

SUMMARY OF THE INVENTION

Problems to be Solved by the Invention

It is known that the metal carbide differs in terms of chemical activity (reactivity) depending on its crystal plane. In a (111) plane, a (220) plane, a (311) plane, and a (222) plane of the tantalum carbide, reactivity is considered to be high because atomic densities of tantalum (Ta) and carbon (C) are not equal.

Therefore, when the tantalum carbide coated carbon material as disclosed in JP 2008-308701 is used as a member for an apparatus for manufacturing a semiconductor single crystal, since the reactivity of the tantalum carbide coated film is high, there is a risk that product life is shortened.

Accordingly, an object of the present invention is to provide a member for an apparatus for manufacturing a semiconductor single crystal having a long product life and a tantalum carbide coated carbon material.

Means for Solving the Problems

In order to solve the above problems, a tantalum carbide coated carbon material according to the present invention is a tantalum carbide coated carbon material in which at least a part of a surface of a carbon base material is coated with a tantalum carbide coated film containing tantalum carbide as a main component. In the tantalum carbide coated carbon material, an intensity of an X-ray diffraction line corresponding to a (200) plane with respect to an out-of-plane direction is larger than intensities of X-ray diffraction lines corresponding to other crystal planes, and the intensity ratio is 60% or more with respect to a sum of intensities of X-ray diffraction lines corresponding to all crystal planes.

According to such a configuration, it is possible to prolong the product life of the tantalum carbide coated carbon material.

In the tantalum carbide coated carbon material according to the present invention, an arithmetic mean roughness Ra of a surface of the tantalum carbide coated film may be 3.5 μm or less.

In the tantalum carbide coated carbon material according to the present invention, an arithmetic mean roughness Ra of a surface of the carbon base material may be 4.0 μm or less.

In the tantalum carbide coated carbon material according to the present invention, the number of tantalum atoms contained in the tantalum carbide coated film may be larger than the number of carbon atoms and may be 1.2 times or smaller the number of carbon atoms.

In the tantalum carbide coated carbon material according to the present invention, the tantalum carbide coated film may contain a chlorine atom at an atomic concentration of 0.01 atm % or more and 1.00 atm % or less.

A member for an apparatus for manufacturing a semiconductor single crystal according to the present invention is composed of a tantalum carbide coated carbon material. The member for an apparatus for manufacturing a semiconductor single crystal is a member in which at least a part of a surface of a carbon base material is coated with a tantalum carbide coated film containing tantalum carbide as a main component, and intensity of an X-ray diffraction line corresponding to a (200) plane with respect to an out-of-plane direction is larger than the intensities of the X-ray diffraction lines corresponding to other crystal planes, and the intensity ratio is 60% or more with respect to a sum of intensities of X-ray diffraction lines corresponding to all crystal planes.

According to such a configuration, it is possible to prolong the product life of the member for an apparatus for manufacturing a semiconductor single crystal composed of a tantalum carbide coated carbon material. As a result, it is possible to lower manufacturing cost of the semiconductor single crystal.

The member for an apparatus for manufacturing a semiconductor single crystal according to the present invention may be used in an apparatus for manufacturing a SiC single crystal.

The member for an apparatus for manufacturing a semiconductor single crystal according to the present invention may be a crucible or a guide member used in an apparatus for manufacturing a SiC single crystal by a sublimation recrystallization method.

The member for an apparatus for manufacturing a semiconductor single crystal according to the present invention may be a susceptor or an inner wall member used in an apparatus for manufacturing a SiC single crystal by epitaxially growing the SiC single crystal by a chemical vapor deposition method.

The member for an apparatus for manufacturing a semiconductor single crystal according to the present invention may have two or more locations where a concentration of tantalum atom is low on the surface of the tantalum carbide coated film.

A method for manufacturing a tantalum carbide coated carbon material according to the present invention includes: preparing a carbon base material having an arithmetic surface roughness Ra of 4.0 μm or less; and coating at least a part of a surface of the carbon base material with a tantalum carbide coated film.

According to such a configuration, it is possible to manufacture the tantalum carbide coated carbon material in which a peeling strength between the carbon base material and the tantalum carbide coated film is 1 MPa or more and an intensity ratio of an X-ray diffraction line corresponding to a (200) plane of the tantalum carbide coated film is 60% or more with respect to a sum of intensities of all X-ray diffraction lines.

In the method for manufacturing a tantalum carbide coated carbon material according to the present invention, the preparing may include supporting the carbon base material in a reaction chamber, and the coating may include supplying a raw material gas that contains a compound containing a carbon atom and halogenated tantalum into the reaction chamber and forming the tantalum carbide coated film by reacting the supplied raw material gas with a thermal CVD method.

In the method for manufacturing a tantalum carbide coated carbon material according to the present invention, a carbon base material may be coated with the tantalum carbide coated film while rotating about a rotation axis. In this method, the tantalum carbide film may be coated while revolving the rotation axis about a revolution axis.

In the method for manufacturing a tantalum carbide coated carbon material according to the present invention, in the supplying of the raw material gas, the temperature in the reaction chamber may be set to be 850° C. or higher and 1200° C. or lower.

In the method for producing a tantalum carbide coated carbon material according to the present invention, in the supplying of the raw material gas, the compound containing the carbon atom may be methane ($CH_4$), and the halogenated tantalum may be tantalum pentachloride ($TaCl_5$). A flow ratio of the methane to be supplied to the tantalum pentachloride may be 2 or more and 20 or less.

The method for manufacturing a tantalum carbide coated carbon material according to the present invention may further include annealing the carbon base material on which the tantalum carbide coated film is formed after the coating.

DETAILED DESCRIPTION OF THE EMBODIMENTS

Hereinafter, embodiments of the present invention will be described in detail, but the present invention is not limited thereto.

A tantalum carbide coated carbon material of the present invention is constituted by a carbon base material and a tantalum carbide coated film containing tantalum carbide as a main component, and at least a part of a surface of the carbon base material is coated with a tantalum carbide coated film.

As a carbon base material 4, a carbon material such as isotropic graphite, extruded graphite, pyrolytic graphite, and carbon fiber reinforced carbon composite material (C/C composite) can be used. A shape and characteristics of the carbon base material 4 are not particularly limited, and the carbon base material can be processed into an arbitrary shape according to usage and the like.

A tantalum carbide coated film containing tantalum carbide as a main component can be formed by methods such as a chemical vapor deposition (CVD) method, a sintering method, and a carbonization method. Among them, the CVD method can form a uniform and dense film, and therefore is preferable as a method for forming a tantalum carbide coated film.

Figure 1:
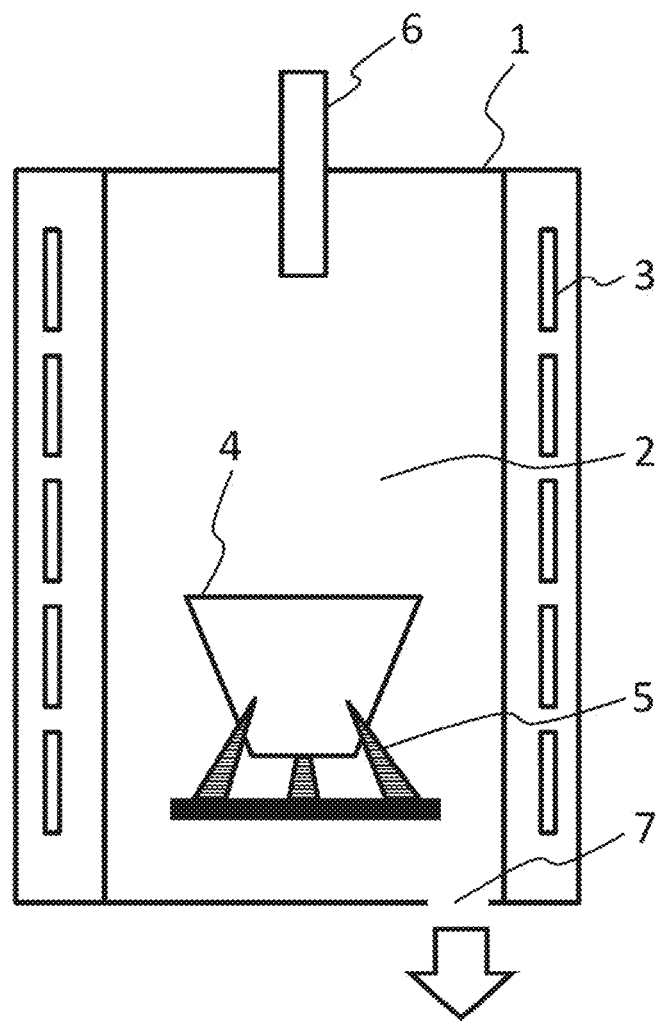
FIG. 1 is a schematic diagram of an external heating type reduced pressure CVD apparatus.

In addition, the CVD method includes a thermal CVD method, a photo CVD method, a plasma CVD method, and the like, and for example, the thermal CVD method can be used. The thermal CVD method has an advantage in that an apparatus configuration is relatively simple and is not damaged due to plasma. Formation of the tantalum carbide coated film by the thermal CVD method can be performed, for example, by using an external heating type reduced pressure CVD apparatus 1 as shown in FIG. 1.

In the external heating type reduced pressure CVD apparatus 1, the carbon base material 4 is supported by a support means 5 in a reaction chamber 2 having a heater 3, a raw material supply unit 6, an exhaust unit 7, and the like. As a raw material gas, a compound containing a carbon atom such as methane ($CH_4$) and halogenated tantalum such as tantalum pentachloride ($TaCl_5$) are supplied from the raw material supply unit 6. The halogenated tantalum gas can be generated by, for example, a method of heating and vaporizing tantalum halide, a method of reacting tantalum metal with a halogen gas, or the like. Subsequently, the raw material gas supplied from the raw material supply unit 6 is subjected to a thermal CVD reaction under a high-temperature reduced pressure of 900 to 1200° C. and 1 to 100 Pa to form a tantalum carbide coated film on the carbon base material 4.

The tantalum carbide coated film contains tantalum carbide as a main component, but it may contain a trace of atoms other than carbon and tantalum. Specifically, the tantalum carbide coated film may contain an impurity element or a doping element in an amount of 1.0 atm % or less.

The tantalum carbide coated film may coat the entire surface of the carbon base material 4 or partially coat the surface of the carbon base material 4 according to its usage and use form. In addition, the tantalum carbide coated film may be separately formed several times and stacked. A location where the carbon base material 4 is exposed or a location where a concentration of tantalum atom is low can be reliably removed by changing a location where the carbon base material 4 is supported in the first and second times to form a film, but manufacturing cost is increased.

Figure 9:
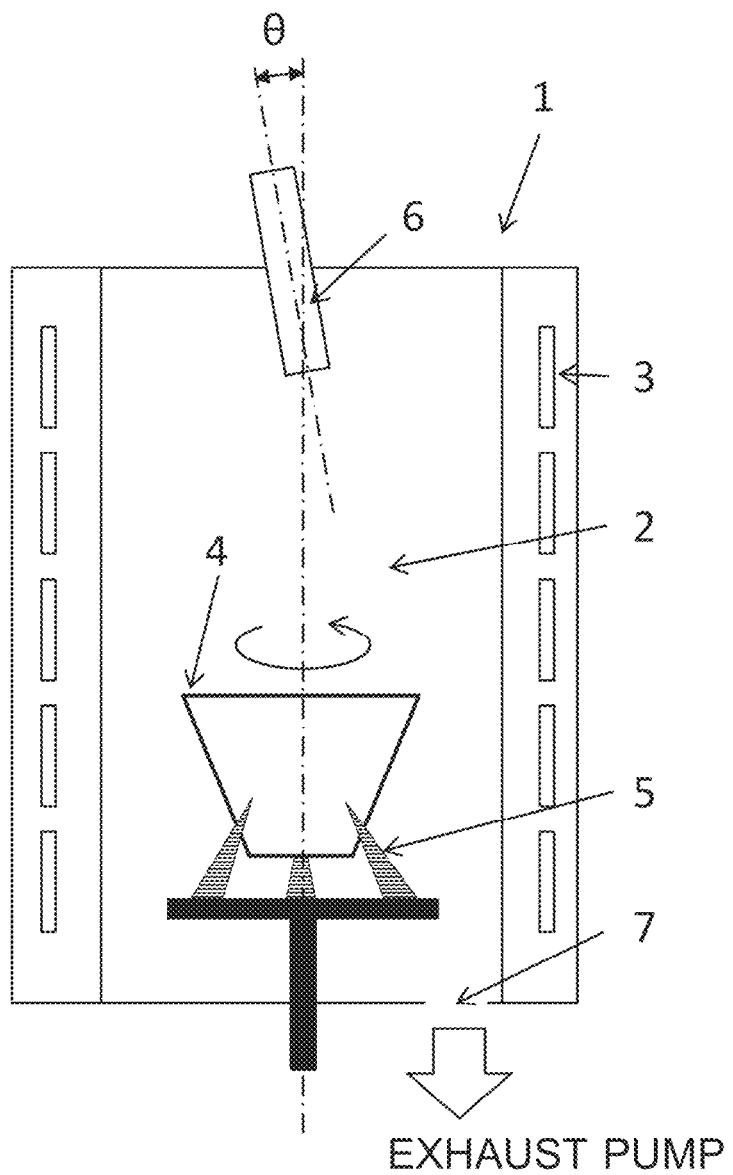
FIG. 9 is a schematic diagram showing a configuration of the external heating type reduced pressure CVD apparatus for forming a tantalum carbide coated film while rotating a carbon base material.

When the tantalum carbide coated film is formed, a position where the carbon base material 4 is mounted is shifted from a center of the heater 3 or a heat generation distribution becomes non-uniform in a circumferential direction of the heater 3 due to aging deterioration or the like to make a surface temperature of the carbon base material 4 non-uniform in the circumferential direction, such that the film formation is non-uniform. In order to average the distribution of such a film formation amount during the film formation, the carbon base material 4 may be coated while rotating about its rotation axis. For example, as shown in FIG. 9, the support means 5 can be configured to rotate about a vertical axis, and the carbon base material 4 is supported so that its rotation axis coincides with a rotation axis of the support means 5. A tantalum carbide coated film is formed while the support means 5 rotates. In this way, it is possible to form the uniform coated film in the circumferential direction of the rotation axis of the carbon base material 4. The method for performing coating by the rotation as described above is particularly effective when the shape of the carbon base material 4 is a rotating body or a rotating symmetric body. When the carbon base material 4 is the rotating body or the rotating symmetric body, it is preferable to dispose the carbon base material 4 so that a symmetry axis and the rotation axis of the carbon base material 4 coincide with each other. In addition, a flow of gas in the reaction chamber 2 is different depending on the shape of the carbon base material 4 and the support method until the gas is ejected from the raw material supply unit 6 and discharged from the exhaust unit 7. As a result, a concentration distribution of a film forming material is generated in the reaction chamber 2, and a position at which the film is not formed occurs in a film formation target surface of the carbon base material 4 (even if the film formation amount is averaged by the rotation). In order for the film forming material to fully spread onto the film formation target surface of the carbon base material 4, the flow of gas to the rotating carbon base material 4 in the reaction chamber 2 may be intentionally asymmetric (rotation asymmetry or plane asymmetry). For this purpose, the raw material supply unit 6 or the exhaust unit 7 may be disposed at a position shifted from an extension line of the rotation axis of the carbon base material 4, and the gas ejected from the raw material supply unit 6 has an inclination θ with respect to the rotation axis and an angle θ may also be adjusted.

Figure 10A:
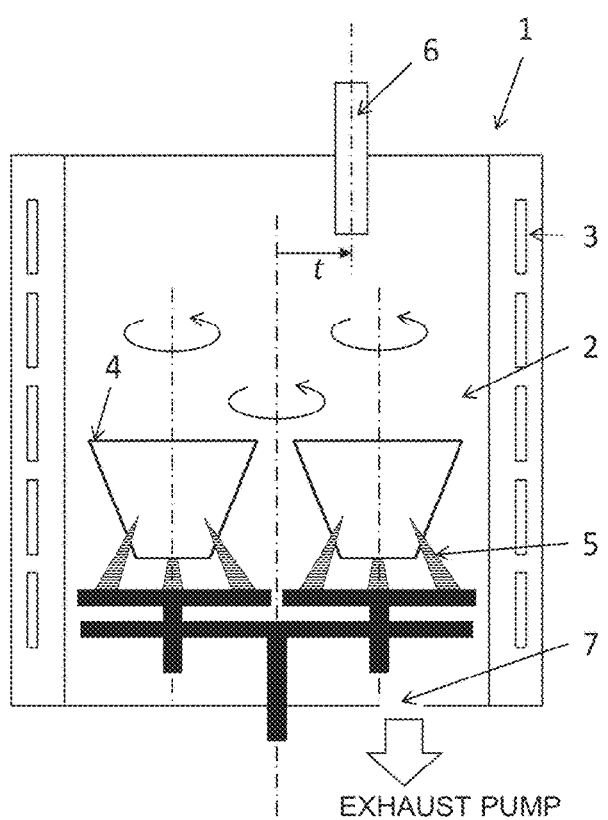
FIG. 10A is a schematic diagram showing a configuration of the external heating type reduced pressure CVD apparatus for forming a tantalum carbide coated film while rotating and revolving a carbon base material.
Figure 10B:
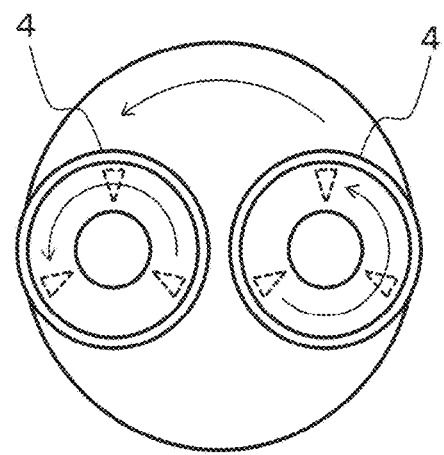
FIG. 10B is a plan view showing an appearance of a rotation and a revolution.

In addition, in the configuration in which the carbon base material 4 is coated while rotating about the rotation axis, the coated film may be formed while the rotation axis revolves another revolution axis. For example, as shown in FIG. 10A, the plurality of support means 5 which can rotate about the vertical axis is prepared, the support means is configured to revolve about the revolution axis, and the carbon base material 4 is supported by each support means 5. By doing so, the plurality of carbon base materials 4 rotating on their revolution orbits are disposed, and as shown in FIG. 10B, the tantalum carbide coated film is formed while revolving and rotating the respective carbon base materials 4. In this way, the coated films formed on the respective carbon base materials can be uniformly aligned. At this time, it is preferable that a rotation speed of the rotation of the carbon base material 4 is set to be a rotation speed other than an integral multiple of a rotation speed of the revolution (for example, 2.1 times, 2.3 times, and the like). By doing so, every time the rotation axis of the carbon base material 4 revolves once and reaches the same revolution angle position, the rotation angle of the carbon base material 4 (in short, a position angle of the carbon base material closest to the heater 3) can be made different from each other. This makes it possible to reduce a deviation of the film formation on a film formation symmetry plane of the carbon base material 4. However, even when the rotation speed of the rotation is set to be a non-integral multiple of the rotation speed of the revolution, it is preferable to avoid a rotation ratio (for example, 2.5 times) at which the direction of the carbon base material 4 is exactly shifted by 180° when revolving once because the direction of the carbon base material 4 returns to an original position (0°) when revolving twice and an elliptical deviation tends to occur. For the same reason, it is preferable to avoid the rotation ratio at which the direction of the carbon base material 4 is shifted by 120°, 90°, 72° (or 144°), and 60° when revolving once. At this time, the flow of gas to the revolving carbon base material 4 may be intentionally asymmetric so that the film-forming material fully spreads onto the film formation symmetry surfaces of each carbon base material. For this purpose, the raw material supply unit 6 is shifted from the revolution axis so as to have an offset t, and the offset t may be adjusted so as to form a desired coated film according to the shape or a revolution radius of the carbon base material 4. In addition, it may be inclined with respect to the revolution axis and the rotation axis. In the case where it is desired to perform coating only on a part of each of the plurality of carbon base materials 4, the carbon base material 4 can be coated only by the revolution without rotating.

According to the present invention, in the tantalum carbide coated film, intensity of an X-ray diffraction line corresponding to a (200) plane with respect to an out-of-plane direction is larger than intensities of X-ray diffraction lines corresponding to other crystal planes, and the intensity ratio is 60% or more with respect to a sum of intensities of X-ray diffraction lines corresponding to all crystal planes.

The intensity of the X-ray diffraction line of the tantalum carbide coated film is obtained by 2θ/θ measurement (out-of-plane) using an X-ray diffractometer (XRD). A peak corresponding to the (200) plane of the tantalum carbide crystal is observed around 2θ=40°.

If the peak intensity corresponding to the (200) plane is larger than peaks corresponding to other crystal planes and the intensity ratio is 60% or more with respect to the sum of the peak intensities corresponding to all the crystal planes, it is possible to prolong a product life of a member for an apparatus for manufacturing a semiconductor single crystal using the tantalum carbide coated carbon material. This is considered to be due to the fact that atomic densities of carbon and tantalum are equal on the (200) plane of the tantalum carbide and the reactivity on the surface of the tantalum carbide coated film is lowered.

The intensity or intensity ratio of the X-ray diffraction line corresponding to the (200) plane of the tantalum carbide coated film is determined by various film formation conditions. In the case of forming the tantalum carbide coated film by the thermal CVD, if the reaction temperature in the reaction chamber 2 is set to be 1000° C. or higher and 1200° C. or lower, the intensity of the X-ray diffraction line corresponding to the (200) plane tends to be larger than the intensities of the X-ray diffraction lines corresponding to other crystal planes. In addition, the intensity of the X-ray diffraction line corresponding to the (200) plane tends to be larger than the intensities of the X-ray diffraction lines corresponding to other crystal planes by performing annealing processing at about 2000 to 2500° C. after the film formation. In addition, a flow ratio of the raw material gas (methane and tantalum pentachloride) supplied into the reaction chamber 2 affects the intensity of the X-ray diffraction line corresponding to the (200) plane. For example, if the flow ratio ($CH_4/TaCl_5$) of the raw material gas supplied into the reaction chamber 2 is set to be 4.0 to 6.0, the intensity of the X-ray diffraction line corresponding to the (200) plane tends to be increased.

An arithmetic mean roughness Ra of the surface of the carbon base material also affects the intensity or intensity ratio of the X-ray diffraction line corresponding to the (200) plane of the tantalum carbide coated film. As a value of the arithmetic mean roughness Ra of the surface of the carbon base material is increased, a peeling strength of the carbon base material 4 and the tantalum carbide coated film tends to be preferably increased, but on the other hand, the intensity ratio of the X-ray diffraction line corresponding to the (200) plane tends to be decreased. Therefore, from the viewpoint of the intensity ratio of the X-ray diffraction line corresponding to the (200) plane, the arithmetic mean roughness Ra of the surface of the carbon base material is preferably 4.0 μm or less.

Considering the peeling strength between the carbon base material 4 and the tantalum carbide coated film and the intensity ratio of the X-ray diffraction line corresponding to the (200) plane of the tantalum carbide coated film, the arithmetic mean roughness Ra of the surface of the carbon base material 4 is preferably 0.5 μm or more and 4.0 μm or less, and more preferably, 1.0 μm or more and 3.0 μm or less. By doing so, it is possible to easily set the intensity ratio of the X-ray diffraction line corresponding to the (200) plane of the tantalum carbide coated film to be 60% or more when the peeling strength between the carbon base material 4 and the tantalum carbide coated film is 1 MPa or more.

In addition, the arithmetic mean roughness Ra of the surface of the tantalum carbide coated film is preferably 3.5 μm or less, and more preferably 3.0 μm or less. When the value of the arithmetic mean roughness Ra of the surface of the tantalum carbide coated film is large, there is a case that the product life of the member for an apparatus for manufacturing a semiconductor single crystal is shortened. This is considered to be due to the fact that the less unevenness on the surface of the tantalum carbide coated film, the smaller the surface area and the lower the reactivity.

The arithmetic mean roughness Ra of the surface of the tantalum carbide coated film immediately after the film formation fluctuates depending on the arithmetic mean roughness Ra of the surface of the carbon base material and tends to be slightly smaller than the arithmetic mean roughness Ra of the surface of the carbon base material. Although the arithmetic mean roughness Ra of the surface of the tantalum carbide coated film can be controlled by polishing or the like, since the number of manufacturing processes is increased, it is preferable to select the arithmetic mean roughness Ra of the surface of the carbon base material 4 depending on the arithmetic mean roughness Ra of the surface of the desired tantalum carbide coated film.

As described above, the arithmetic mean roughness Ra of the surface of the carbon base material 4 affects the peeling strength between the carbon base material 4 and the tantalum carbide coated film, and it is not preferable that the value of the arithmetic mean roughness R is too small. Therefore, the arithmetic mean roughness Ra of the surface of the tantalum carbide coated film is preferably 0.4 μm or more, more preferably 0.8 μm or more, depending on the arithmetic mean roughness Ra of the surface of the carbon base material 4.

Here, the arithmetic mean roughness Ra is a value measured based on JIS B 0633:2001 (ISO 4288:1996).

The number of tantalum atoms contained in the tantalum carbide coated film is preferably more than the number of carbon atoms, preferably 1.2 times or less, and more preferably 1.05 to 1.15 times the number of carbon atoms. That is, it is represented by $Ta_xC$ ($1.0 < x \leq 1.2$).

If the number of carbon atoms is large, a lot of carbon atoms are present in the tantalum carbide coated film. Since carbon has higher reactivity than tantalum, the reactivity of the tantalum carbide coated film becomes high, and the product life of the member for an apparatus for manufacturing a semiconductor single crystal is shortened. On the other hand, if the number of tantalum atoms is increased, the number of carbon atoms is decreased, the reactivity of the tantalum carbide coated film can be lowered, and the product life for the member for an apparatus for manufacturing a semiconductor single crystal is also prolonged.

In addition, an atomic concentration of chlorine atom contained in the tantalum carbide coated film is preferably 0.01 atm % or more and 1.00 atm % or less, and more preferably 0.02 atm % or more and 0.06 atm % or less. If the atomic concentration of the chlorine atom is too high, it affects the characteristics of the tantalum carbide coated film, which is not preferable, but it is possible to lower a concentration of impurity metal such as iron in the coated film by containing the atomic concentration of the chlorine atom to some extent.

In addition, the member for an apparatus for manufacturing a semiconductor single crystal of the present invention, at least a part of the surface of the carbon base material 4 is composed of the tantalum carbide coated carbon material coated with the tantalum carbide coated film containing the tantalum carbide as the main component. In the tantalum carbide coated film, the intensity of the X-ray diffraction line corresponding to the (200) plane with respect to the out-of-plane direction is larger than the intensities of the X-ray diffraction lines corresponding to other crystal planes, and the intensity ratio is 60% or more with respect to the sum of the intensities of the X-ray diffraction lines corresponding to all crystal planes.

With such a member for an apparatus for manufacturing a semiconductor single crystal, it is possible to prolong the product life by suppressing adhesion of a semiconductor single crystal to the member during the growth of the semiconductor single crystal. This is considered to be due to the fact that the atomic densities of the carbon and the tantalum are equal on the (200) plane of the tantalum carbide and the reactivity is lower than that of other crystal planes, and the effect is not limited by the type and manufacturing method of the semiconductor single crystal to be grown.

On the other hand, since the tantalum carbide has low wettability to silicon carbide (SiC) and the life of the member can be expected to be prolonged, the tantalum carbide coated carbon material has been used as a member for an apparatus for manufacturing a SiC single crystal from the past. Therefore, the tantalum carbide coated carbon material is in particular useful for a crucible 12 or a guide member 9 used in the apparatus for manufacturing a SiC single crystal by the sublimation recrystallization method, and a susceptor 21 or an inner wall member 18 used in the apparatus for epitaxially growing a SiC single crystal by the CVD method.

The member for an apparatus for manufacturing a semiconductor single crystal is obtained, for example, by coating the surface of the carbon material processed to the shape of the member as the carbon base material 4 with the tantalum carbide coated film containing the tantalum carbide as a main component. If necessary, further processing may be performed, or other materials or the like may be used in combination.

When the tantalum carbide coated film is coated with the carbon base material 4, the above-described method can be used, for example, the thermal CVD method can be used.

At this time, the support means 5 for supporting the carbon base material 4 has a support portion having a pointed tip, and it is preferable that the carbon base material 4 is supported at two or more locations on the tip of this support portion and it is more preferable that the carbon base material 4 is supported at three locations on the tip of this support portion. By doing so, it is possible to minimize a contact area between the tip of the support portion and the carbon base material 4, and coating the entire surface of the carbon base material 4 with the tantalum carbide coated film is also completed by one coating process, which results in reducing the manufacturing cost.

However, although the tantalum carbide coated film is coated in the vicinity of such a support location, the concentration of the tantalum atom becomes low. When such a location is inside the crucible 12 or the guide member 9, there is a risk that the quality of the SiC single crystal to be grown will be affected. Therefore, it is preferable to provide such a support portion with a low-concentration tantalum atom on the outside of the crucible 12 or the guide member 9. By doing so, the quality of the SiC single crystal to be grown is not affected.

In addition, since the member for an apparatus for manufacturing a semiconductor single crystal is repeatedly used a plurality of times, it is preferable that the crystallinity of the tantalum carbide coated film is not modified during the growth of the semiconductor single crystal. For example, in the case of growing the SiC single crystal by the sublimation recrystallization method, even when heating to 2500° C. under an inert atmosphere of $1.0 \times 10^3$ Pa or less, in the tantalum carbide coated film, the intensity of the X-ray diffraction line corresponding to the (200) plane is larger than the intensities of the X-ray diffraction lines corresponding to other crystal planes, and the intensity ratio is 60% or more with respect to the sum of the intensities of the X-ray diffraction lines corresponding to all the crystal planes.

EXAMPLE

Hereinafter, the present invention will be described in detail with reference to Examples, but the present invention is not limited to these Examples.

Example 1

First, isotropic graphite was processed into a circular truncated cone shape (guide member 9), a bottomed cylindrical shape (crucible 12), a disk shape (susceptor 21), and a cylindrical shape (inner wall member 18), which were used as the carbon base material 4. The arithmetic mean roughness Ra of the surface of the carbon base material 4 was set to be 0.5 μm.

Next, the carbon base material 4 was mounted in the reaction chamber 2 of the external heat type reduced pressure CVD apparatus 1. The carbon base material 4 was supported by the support means 5 having three support portions having a pointed tip shape. At this time, the tip of the support portion comes into contact with an outer surface in the case of the cylindrical truncated cone-shaped carbon base material 4, an outer surface in the case of the bottomed cylindrical-shaped carbon base material 4, a lower surface in the case of the disk-shaped carbon base material 4, and an outer surface in the case of the cylindrical carbon base material 4.

Subsequently, the tantalum carbide coated film having a film thickness of 30 μm was formed on the entire surface of the carbon base material 4 by supplying, from the raw material supply unit 6, 0.1 SLM of tantalum pentachloride ($TaCl_5$) vaporized by heating 0.5 SLM of methane ($CH_4$) gas, 1.5 SLM of argon (Ar) gas as a carrier gas at a temperature of 120 to 220° C. and reacting the tantalum pentachloride in the reaction chamber 2 of an atmospheric pressure of 10 to 100 Pa and a temperature of 1100° C.

The carbon base material 4 coated with the tantalum carbide coated film was taken out from the reaction chamber 2 to complete the crucible 12 composed of the tantalum carbide coated carbon material, the guide member 9, the susceptor 21, and the inner wall member 18.

2 θ/θ measurement (out-of-plane) was performed on the manufactured crucible 12 and guide member 9 by using an XRD apparatus (RINT-2500VHF manufactured by Rigaku Corporation). As a result, it was found that the intensity of the X-ray diffraction line corresponding to the (200) plane of the tantalum carbide coated film is larger than the intensities of the X-ray diffraction lines corresponding to other crystal planes, and the intensity ratio is 96.4% or more with respect to the sum of the intensities of the X-ray diffraction lines corresponding to all the crystal planes.

In addition, the arithmetic mean roughness Ra of the surface of the tantalum carbide coated film was measured using SURFTEST SJ-210 manufactured by Mitutoyo Corporation. As a result, the arithmetic mean roughness Ra of the surface of the tantalum carbide coated film was 0.4 µm.

In addition, the concentration of impurities in the tantalum carbide coated film was evaluated by a glow discharge mass spectrometry (GDMS). As a result, it was found that 0.050 atm % of chlorine and 0.02 atm % of iron were contained in the tantalum carbide coated film. The analysis was performed using VG9000, Element GD, and Astrum manufactured from V.G. Scientific, Inc. In addition, it was confirmed that the concentration of the tantalum atom was low around three locations that were in contact with the tip of the support portion.

Figure 2:
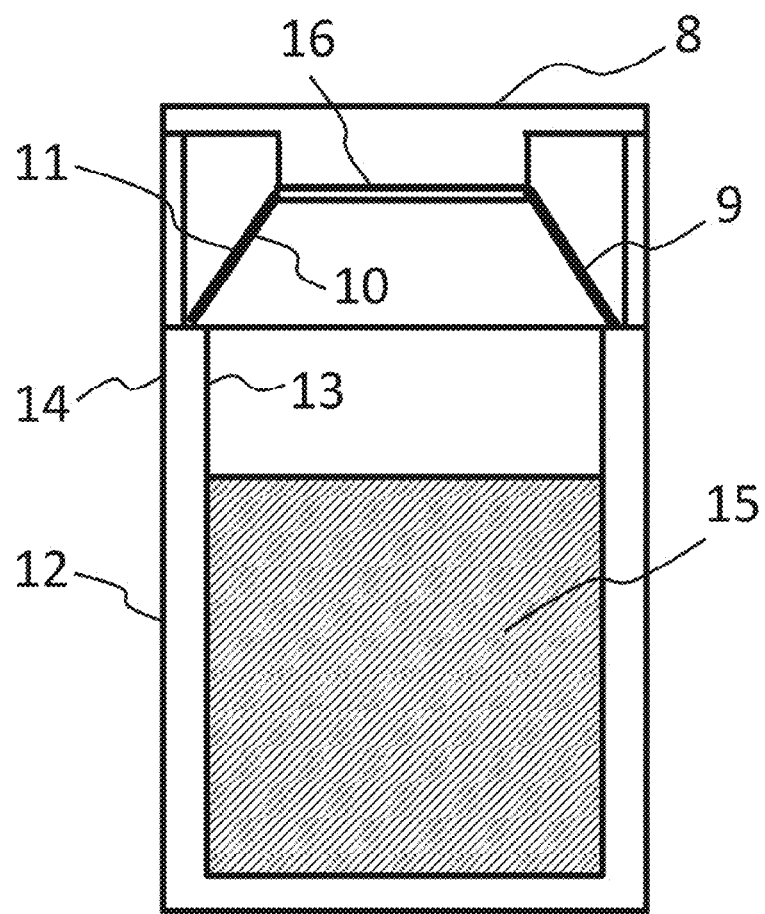
FIG. 2 shows a schematic view of a reduced pressure heating furnace for growing a SiC single crystal by a sublimation recrystallization method.

The SiC single crystal was grown by the sublimation recrystallization method by mounting the manufactured crucible 12 and the guide member 9 in the reduced pressure heating furnace 8 as shown in FIG. 2. The SiC raw material 15 was introduced into the crucible 12, and the SiC seed crystal 16 having a diameter of 2 inches was mounted on the upper part thereof. The SiC single crystal was grown on the SiC seed crystal 16 to a thickness of 5 mm by introducing the argon gas into the reduced pressure heating furnace 8 at 10 to 30 slm, setting the reduced pressure heating function 8 to be an atmospheric pressure of 500 to 1000 Pa and a temperature of 2000 to 2500° C. to sublimate the SiC raw material 15.

The SiC single crystal was repeatedly manufactured several times to confirm how many the SiC crystals adheres to the crucible 12 and the guide member 9. As a result, the adhesion of the SiC crystal was confirmed after being used 23 times, which needs to be replaced with a new member.

Figure 3:
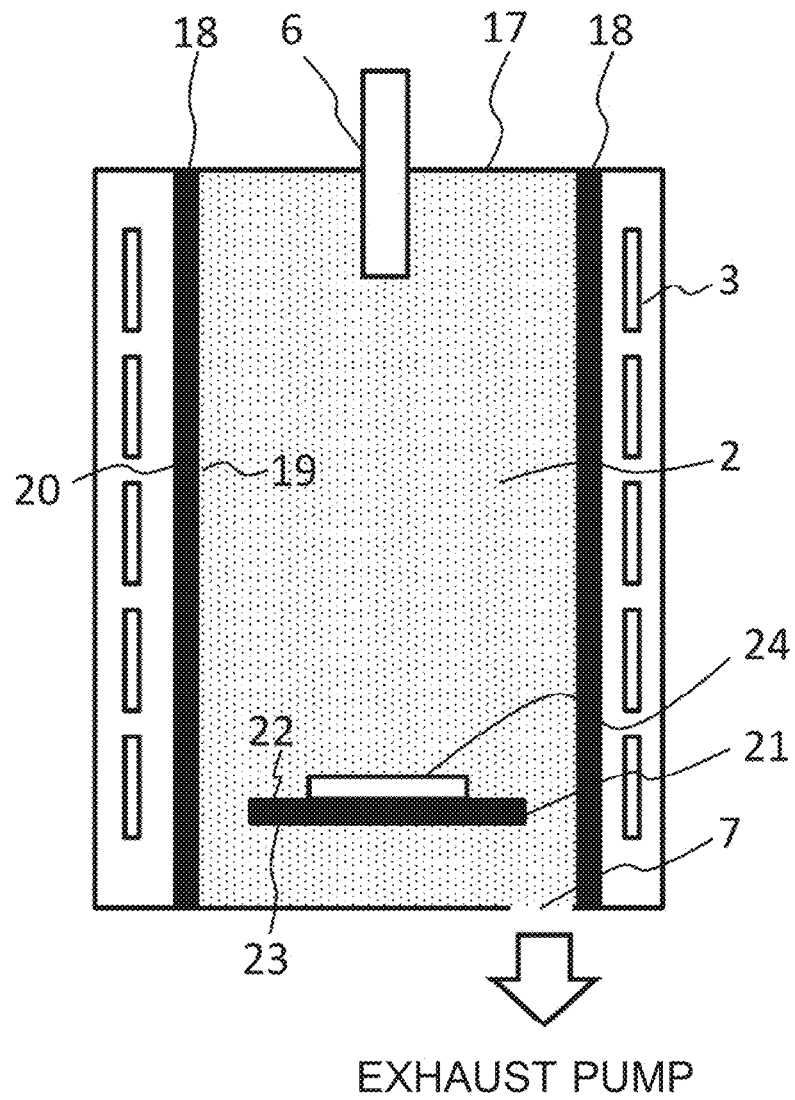
FIG. 3 is a schematic diagram of the CVD apparatus 1 for epitaxially growing the SiC single crystal.
Figure 4:
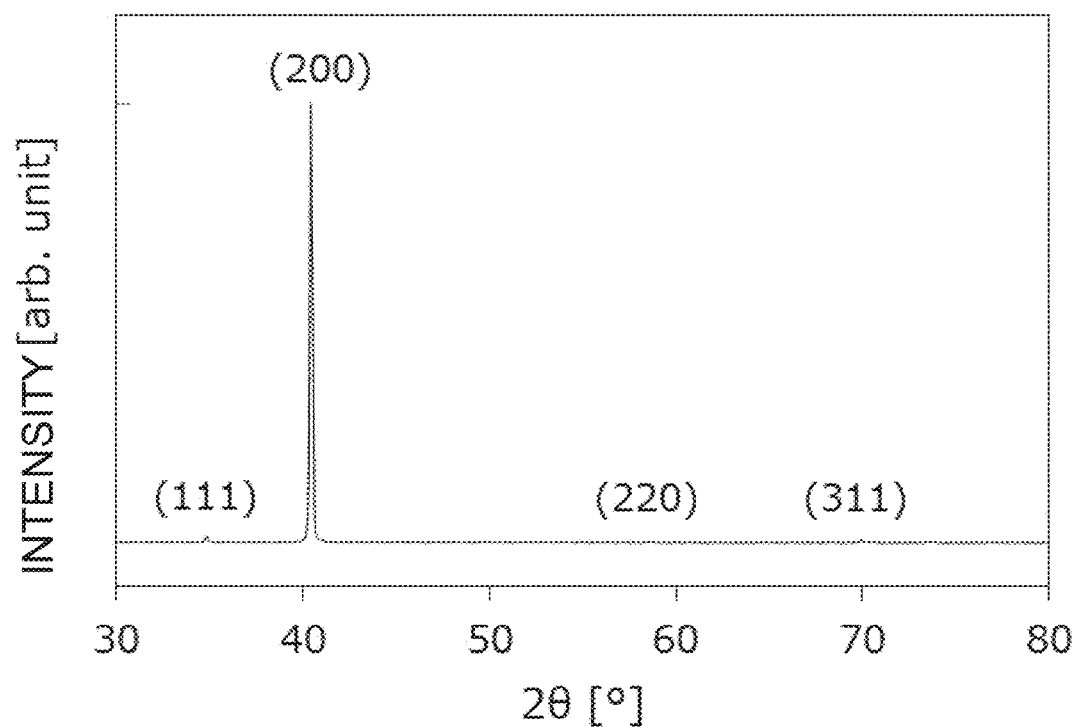
FIG. 4 is a diagram showing an XRD pattern of a tantalum carbide coated film of Example 1.
Figure 5:
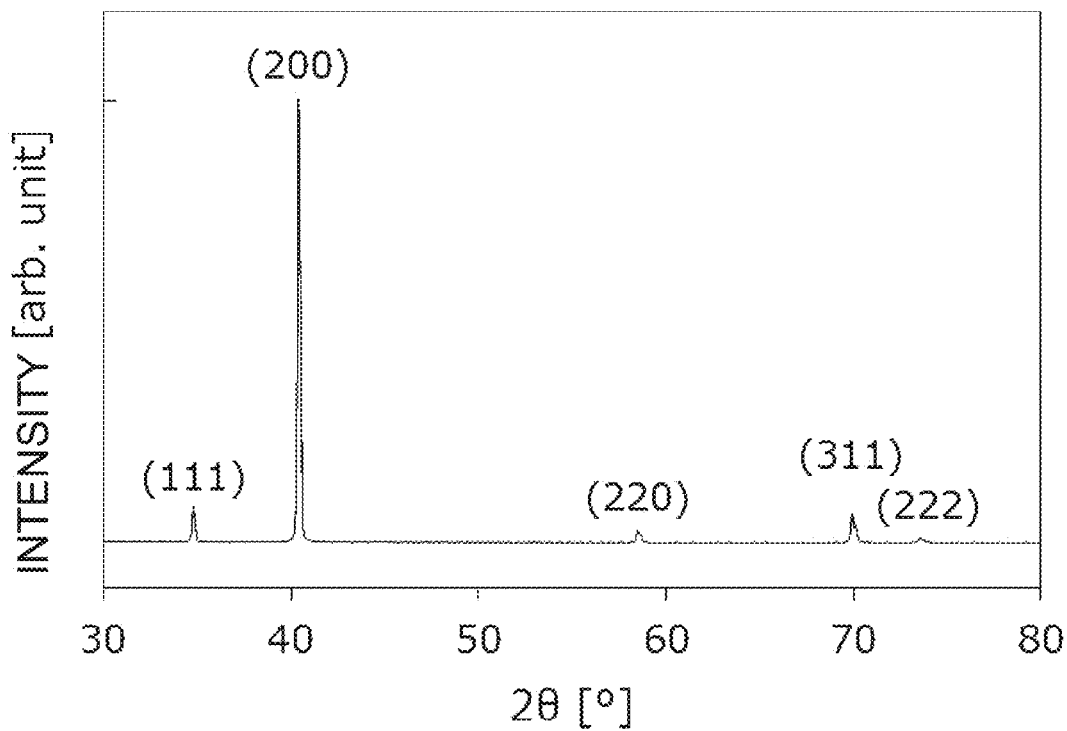
FIG. 5 is a diagram showing an XRD pattern of a tantalum carbide coated film of Example 3.
Figure 6:
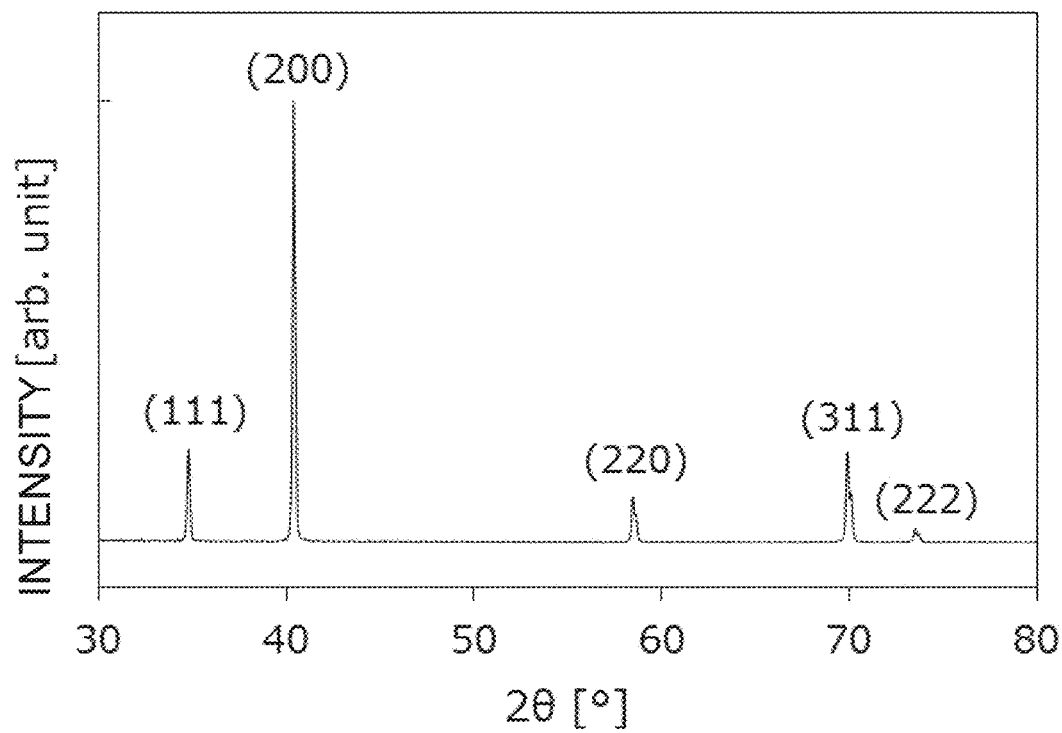
FIG. 6 is a diagram showing an XRD pattern of a tantalum carbide coated film of Comparative Example 1.
Figure 7:
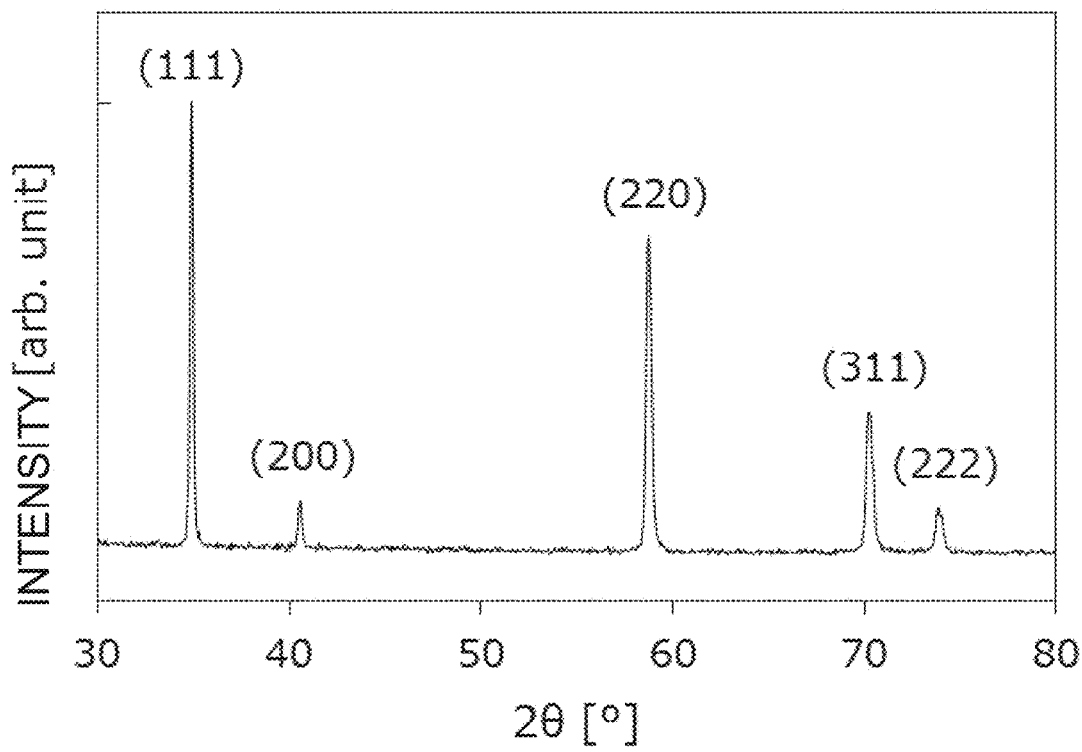
FIG. 7 is a diagram showing an XRD pattern of a tantalum carbide coated film of Comparative Example 3.
Figure 8:
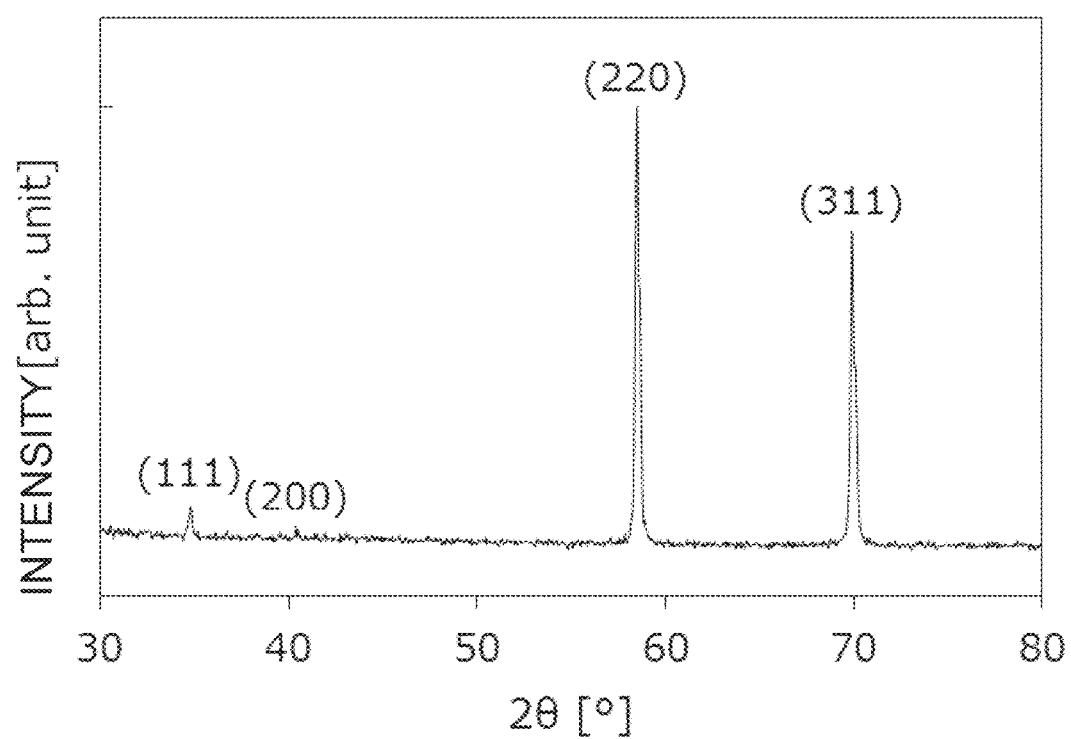
FIG. 8 is a diagram showing an XRD pattern of a tantalum carbide coated film of Comparative Example 4.

The manufactured susceptor 21 and the inner wall member 18 were mounted in the CVD apparatus 17 as shown in FIG. 3 to epitaxially grow the SiC single crystal using the CVD method. A SiC single crystal substrate 24 processed into the substrate shape from the bulk single crystal was mounted on the susceptor 21. The SiC single crystal was epitaxially grown on the substrate by introducing monosilane ($SiH_4$) and propane ($C_3H_8$) into the CVD apparatus at 30 sccm and 70 sccm, respectively, and setting the CVD apparatus to be an atmospheric pressure of 45 Torr and a temperature of 1550° C.

The SiC single crystal was repeatedly manufactured several times to confirm how many the SiC crystals adheres to the susceptor 21 and the inner wall member 18. As a result, it is confirmed that after the adhesion of the SiC crystal is made 94 times, the SiC crystal needs to be replaced with a new member. Table 1 shows these conditions and results.

Example 2

Except that the arithmetic mean roughness Ra of the surface of the carbon base material 4 was set to be 1.0 µm, the crucible 12, the guide member 9, the susceptor 21, and the inner wall member 18 were manufactured by the same manner as Example 1 and the evaluation was performed. The results are shown in Table 1.

Example 3

Except that the arithmetic mean roughness Ra of the surface of the carbon base material was set to be 2.0 µm, the crucible 12, the guide member 9, the susceptor 21, and the inner wall member 18 were manufactured by the same manner as Example 1 and the evaluation was performed. The results are shown in Table 1.

Example 4

Except that the arithmetic mean roughness Ra of the surface of the carbon base material 4 was set to be 3.0 µm, the crucible 12, the guide member 9, the susceptor 21, and the inner wall member 18 were manufactured by the same manner as Example 1 and the evaluation was performed. The results are shown in Table 1.

Example 5

Except that the arithmetic mean roughness Ra of the surface of the carbon base material 4 was set to be 4.0 µm, the crucible 12, the guide member 9, the susceptor 21, and the inner wall member 18 were manufactured by the same manner as Example 1 and the evaluation was performed. The results are shown in Table 1.

Example 6

First, the crucible 12, the guide member 9, the susceptor 21, and the inner wall member 18 were manufactured in the same manner as in Example 3. The surface of the tantalum carbide coated film of the crucible 12, the guide member 9, the susceptor 21, and the inner wall member 18 was roughened, and thus its arithmetic mean roughness Ra was set to be 3.8 µm. The evaluation was performed in the same manner as in Example 1. The results are shown in Table 1.

Example 7

First, the crucible 12, the guide member 9, the susceptor 21, and the inner wall member 18 were manufactured in the same manner as in Example 3. The surface of the tantalum carbide coated film of the crucible 12, the guide member 9, the susceptor 21, and the inner wall member 18 was roughened, and thus its arithmetic mean roughness Ra was set to be 3.4 µm. The evaluation was performed in the same manner as in Example 1. The results are shown in Table 1.

Example 8

First, the crucible 12, the guide member 9, the susceptor 21, and the inner wall member 18 were manufactured in the same manner as in Example 3. The surface of the tantalum carbide coated film of the crucible 12, the guide member 9, the susceptor 21, and the inner wall member 18 was roughened, and thus its arithmetic mean roughness Ra was set to be 2.8 µm. The evaluation was performed in the same manner as in Example 1. The results are shown in Table 1.

Example 9

First, the crucible 12, the guide member 9, the susceptor 21, and the inner wall member 18 were manufactured in the same manner as in Example 3. The surface of the tantalum carbide coated film of the crucible 12, the guide member 9, the susceptor 21, and the inner wall member 18 was roughened, and thus its arithmetic mean roughness Ra was set to be 2.2 µm. The evaluation was performed in the same manner as in Example 1. The results are shown in Table 1.

Example 10

First, the crucible 12, the guide member 9, the susceptor 21, and the inner wall member 18 were manufactured in the same manner as in Example 3. Thereafter, the annealing processing was performed at 2500° C. The evaluation was performed in the same manner as in Example 1. The results are shown in Table 1.

The concentration of chlorine atom in the tantalum carbide coated film of Example 10 was 0.009 atm %, the concentration of iron atom was 0.10 atm %, and the content of iron was larger than that of Example 3.

Example 11

Except that the film formation temperature of the tantalum carbide coated film was set to be 950° C., the crucible 12, the guide member 9, the susceptor 21, and the inner wall member 18 were manufactured in the same manner as in Example 3. Thereafter, the annealing processing was performed at 2500° C. The evaluation was performed in the same manner as in Example 1. The results are shown in Table 1.

In the tantalum carbide coated film of Example 11, the intensity of the X-ray diffraction line corresponding to the (220) plane was larger than the intensities of the X-ray diffraction lines corresponding to other crystal planes before the annealing processing, but the intensity of the X-ray diffraction line corresponding to the (200) plane is larger than the intensities of the X-ray diffraction lines corresponding to other crystal planes after the annealing processing, and the intensity ratio was 65.4% with respect to the sum of the intensities of the X-ray diffraction lines corresponding to all the crystal planes. In addition, it was found that the concentration of chlorine atom in the tantalum carbide coated film was 0.009 atm % by the annealing processing, and therefore the concentration of iron was 0.10 atm %, and the content of iron was larger than that of Example 3.

Example 12

Except that the film formation frequency of the tantalum carbide coated film is set to be twice, the crucible 12, the guide member 9, the susceptor 21, and the inner wall member 18 were manufactured by the same manner as Example 3 and the evaluation was performed. The results are shown in Table 1.

At this time, in the first time and the second time, the film formation was performed by changing the support location of the carbon base material 4. The concentration of tantalum atom was not reduced around the three locations where the tantalum atom was in contact with the tip of the support portion during the film formation in the first time. In addition, although the concentration of tantalum atom in the vicinity of the surface was low around the three locations where it is in contact with the tip of the support portion during the film formation in the second time, the concentration of tantalum atoms in the tantalum carbide coated film in the vicinity of the carbon base material 4 was not reduced.

Example 13

The base material was configured so that the base material can rotate about the rotation symmetry axis of the base material as the rotation axis, and the raw material supply unit was mounted on the extension line of the rotation axis. A flow rate of $CH_4$ was set to be 0.2 SLM and the film formation temperature was set to be 1200° C. to form the film while the base material rotates. Other than that, the crucible 12, the guide member 9, the susceptor 21, and the inner wall member 18 were manufactured by the same manner as Example 1 and the evaluation was performed. The results are shown in Table 1.

Example 14

Two sets of base materials, in which the base material rotates about the rotation symmetry axis of the base material as the rotation axis, were prepared. The rotation axes of each base material was disposed on a revolution axis having a revolution radius of 180 mm so that their rotation axes were symmetrical with each other about the revolution axis, and the raw material supply unit was disposed on an extension line of the revolution axis. The flow rate of $CH_4$ was set to be 0.75 SLM to form the film while each base material rotates and revolves. Other than that, the crucible 12, the guide member 9, the susceptor 21, and the inner wall member 18 were manufactured by the same manner as Example 1 and the evaluation was performed. The results are shown in Table 1.

Example 15

Two sets of base materials, in which the base material rotates about the rotation symmetry axis of the base material as the rotation axis, were prepared. The rotation axes of each base material was disposed on the revolution axis having the revolution radius of 180 mm so that the rotation axes thereof were symmetrical with each other about the revolution axis, and the raw material supply unit was disposed on an extension line of the revolution axis. The flow rate of $CH_4$ was set to be 1.0 SLM to form the film while each base material rotates and revolves. Other than that, the crucible 12, the guide member 9, the susceptor 21, and the inner wall member 18 were manufactured by the same manner as Example 1 and the evaluation was performed. The results are shown in Table 1.

Example 16

Two sets of base materials, in which the base material rotates about the rotation symmetry axis of the base material as the rotation axis, were prepared. The rotation axes of each base material were disposed on the revolution axis having the revolution radius of 180 mm so that their rotation axes were symmetrical with each other about the revolution axis. The flow rate of $CH_4$ was set to be 1.25 SLM to form the film while each base material rotates and revolves. Other than that, the crucible 12, the guide member 9, the susceptor 21, and the inner wall member 18 were manufactured by the same manner as Example 1 and the evaluation was performed. The results are shown in Table 1.

Example 17

Three sets of base materials, in which the base material rotates about the rotation symmetry axis of the base material as the rotation axis, were prepared. The rotation axes of each base material was disposed on the revolution axis having the revolution radius of 180 mm at equal intervals (that is, at an interval of 120° with respect to the revolution axis), the raw material supply unit was disposed on the extension line of the revolution axis. The flow rate of $CH_4$ was set to be 2.0 SLM and the film formation temperature was set to be 850°

C. to form the film while each base material rotates and revolves. Other than that, the crucible 12, the guide member 9, the susceptor 21, and the inner wall member 18 were manufactured by the same manner as Example 1 and the evaluation was performed. The results are shown in Table 1.

Example 18

Two sets of base materials, in which the base material rotates about the rotation symmetry axis of the base material as the rotation axis, were prepared. The rotation axes of each base material are disposed on the revolution axis having the revolution radius of 180 mm so that their rotation axes are symmetrical with each other about the revolution axis, and the raw material supply unit has an angle of 20° with respect to the revolution axis and an ejection port of the raw material supply unit was disposed so as to be open on the extension line of the revolution axis. The flow rate of $CH_4$ was set to be 0.1 SLM to form the film while each base material rotates and revolves. Other than that, the crucible 12, the guide member 9, the susceptor 21, and the inner wall member 18 were manufactured by the same manner as Example 1 and the evaluation was performed. The results are shown in Table 1.

Example 19

Three sets of base materials, in which the base material rotates about the rotation symmetry axis of the base material as the rotation axis, were prepared. The rotation axes of each base material are disposed on the revolution axis having the revolution radius of 180 mm at equal intervals (that is, at an interval of 120° with respect to the revolution axis), the raw material supply unit has an angle of 20° with respect to the revolution axis, and the ejection port of the raw material supply unit was disposed so as to be open at a position spaced apart from the extension line of the revolution axis by 180 mm. The flow rate of $CH_4$ was set to be 4.0 SLM to form the film while each base material rotates and revolves. Other than that, the crucible 12, the guide member 9, the susceptor 21, and the inner wall member 18 were manufactured by the same manner as Example 1 and the evaluation was performed. The results are shown in Table 1.

Comparative Example 1

Except that the arithmetic mean roughness Ra of the surface of the carbon base material 4 was set to be 4.5 μm, the crucible 12, the guide member 9, the susceptor 21, and the inner wall member 18 were manufactured by the same manner as Example 1 and the evaluation was performed. The results are shown in Table 1.

Comparative Example 2

First, the crucible 12, the guide member 9, the susceptor 21, and the inner wall member 18 were manufactured in the same manner as in Comparative Example 1. The surface of the tantalum carbide coated film of the crucible 12, the guide member 9, the susceptor 21, and the inner wall member 18 was polished, and thus its arithmetic mean roughness Ra was set to be 1.8 μm. The evaluation was performed in the same manner as in Example 1, and the results are shown in Table 1.

Comparative Example 3

Except that the flow rate of $CH_4$ gas was set to be 5 SLM, the crucible 12, the guide member 9, the susceptor 21, and the inner wall member 18 were manufactured by the same manner as Example 3 and the evaluation was performed. The results are shown in Table 1.

Comparative Example 4

Except that the film formation temperature of the tantalum carbide coated film is set to be 950° C., the crucible 12, the guide member 9, the susceptor 21, and the inner wall member 18 were manufactured by the same manner as Example 3 and the evaluation was performed. The results are shown in Table 1.

Comparative Example 5

Except that the film formation temperature of the tantalum carbide coated film is set to be 750° C., the crucible 12, the guide member 9, the susceptor 21, and the inner wall member 18 were manufactured by the same manner as Example 3 and the evaluation was performed. The results are shown in Table 1.

Comparative Example 6

Except that the flow rate of $CH_4$ gas was set to be 0.09 SLM during the film formation, the crucible 12, the guide member 9, the susceptor 21, and the inner wall member 18 were manufactured by the same manner as Example 3 and the evaluation was performed. The results are shown in Table 1.

TABLE 1

|  | Maximum peak | Intensity ratio I(200)/I(SUM) [%] | Ra of carbon base material surface [μm] | Ra of TaC coated film surface [μm] | $CH_4$ flow rate [SLM] | $TaCl_5$ flow rate [SLM] | Film formation temperature [° C.] | Film formation frequeny [times] | Annealing [° C.] |
|---|---|---|---|---|---|---|---|---|---|
| Example 1 | (200) | 96.4 | 0.5 | 0.4 | 0.5 | 0.1 | 1100 | 1 | Absence |
| Example 2 | (200) | 90.1 | 1.0 | 0.9 | 0.5 | 0.1 | 1100 | 1 | Absence |
| Example 3 | (200) | 79.2 | 2.0 | 1.9 | 0.5 | 0.1 | 1100 | 1 | Absence |
| Example 4 | (200) | 70.8 | 3.0 | 2.7 | 0.5 | 0.1 | 1100 | 1 | Absence |
| Example 5 | (200) | 61.0 | 4.0 | 3.5 | 0.5 | 0.1 | 1100 | 1 | Absence |
| Example 6 | (200) | 79.2 | 2.0 | 3.8 | 0.5 | 0.1 | 1100 | 1 | Absence |
| Example 7 | (200) | 79.2 | 2.0 | 3.4 | 0.5 | 0.1 | 1100 | 1 | Absence |
| Example 8 | (200) | 79.3 | 2.0 | 2.8 | 0.5 | 0.1 | 1100 | 1 | Absence |
| Example 9 | (200) | 79.2 | 2.0 | 2.2 | 0.5 | 0.1 | 1100 | 1 | Absence |
| Example 10 | (200) | 79.1 | 2.0 | 1.8 | 0.5 | 0.1 | 1100 | 1 | 2500 |

TABLE 1-continued

| | | | | | | | | |
|---|---|---|---|---|---|---|---|---|
| Example 11 | (200) | 65.4 | 2.0 | 1.9 | 0.5 | 0.1 | 950 | 1 | 2500 |
| Example 12 | (200) | 79.3 | 2.0 | 1.9 | 0.5 | 0.1 | 1100 | 2 | Absence |
| Example 13 | (200) | 70.5 | 0.5 | 0.4 | 0.2 | 0.1 | 1200 | 1 | Absence |
| Example 14 | (200) | 96.4 | 0.5 | 0.4 | 0.75 | 0.1 | 1100 | 1 | Absence |
| Example 15 | (200) | 96.2 | 0.5 | 0.4 | 1.0 | 0.1 | 1100 | 1 | Absence |
| Example 16 | (200) | 92.5 | 0.5 | 0.4 | 1.25 | 0.1 | 1100 | 1 | Absence |
| Example 17 | (200) | 65.2 | 0.5 | 0.4 | 2.0 | 0.1 | 850 | 1 | Absence |
| Example 18 | (200) | 60.5 | 0.5 | 0.4 | 0.1 | 0.1 | 1100 | 1 | Absence |
| Example 19 | (200) | 60.0 | 0.5 | 0.4 | 4.0 | 0.1 | 1100 | 1 | Absence |
| Comparative Example 1 | (200) | 56.1 | 4.5 | 3.7 | 0.5 | 0.1 | 1100 | 1 | Absence |
| Comparative Example 2 | (200) | 56.1 | 4.5 | 1.8 | 0.5 | 0.1 | 1100 | 1 | Absence |
| Comparative Example 3 | (111) | 4.3 | 2.0 | 1.9 | 5.0 | 0.1 | 1100 | 1 | Absence |
| Comparative Example 4 | (220) | 1.0 | 2.0 | 1.9 | 0.5 | 0.1 | 950 | 1 | Absence |
| Comparative Example 5 | (220) | 1.0 | 2.0 | 1.9 | 2.0 | 0.1 | 750 | 1 | Absence |
| Comparative Example 6 | (200) | 55.0 | 2.0 | 1.9 | 0.09 | 0.1 | 1100 | 1 | Absence |

| | Concentration of Cl in TaC coated film [atm %] | Concentration of Fe in TaC coated film [atm %] | Peeling Strength [MPa] | Usable frequency as furnace material [times] | |
|---|---|---|---|---|---|
| | | | | Sublimation recrystallization | CVD method |
| Example 1 | 0.050 | 0.02 | 1.2 | 23 | 94 |
| Example 2 | 0.050 | 0.02 | 2.0 | 19 | 75 |
| Example 3 | 0.050 | 0.02 | 3.5 | 17 | 69 |
| Example 4 | 0.050 | 0.02 | 4.6 | 16 | 64 |
| Example 5 | 0.050 | 0.02 | 5.6 | 11 | 46 |
| Example 6 | 0.050 | 0.02 | 3.6 | 12 | 49 |
| Example 7 | 0.050 | 0.02 | 3.5 | 14 | 57 |
| Example 8 | 0.050 | 0.02 | 3.5 | 15 | 61 |
| Example 9 | 0.050 | 0.02 | 3.6 | 18 | 72 |
| Example 10 | 0.009 | 0.10 | 3.4 | 18 | 71 |
| Example 11 | 0.009 | 0.10 | 3.4 | 11 | 43 |
| Example 12 | 0.050 | 0.02 | 3.5 | 16 | 65 |
| Example 13 | 0.050 | 0.02 | 5.6 | 15 | 64 |
| Example 14 | 0.050 | 0.02 | 1.5 | 19 | 70 |
| Example 15 | 0.050 | 0.02 | 3.0 | 23 | 72 |
| Example 16 | 0.050 | 0.02 | 3.5 | 19 | 69 |
| Example 17 | 0.050 | 0.02 | 4.6 | 12 | 50 |
| Example 18 | 0.050 | 0.02 | 4.6 | 14 | 45 |
| Example 19 | 0.050 | 0.02 | 4.4 | 11 | 41 |
| Comparative Example 1 | 0.050 | 0.02 | 6.0 | 5 | 19 |
| Comparative Example 2 | 0.050 | 0.02 | 6.0 | 9 | 37 |
| Comparative Example 3 | 0.015 | 0.06 | 3.5 | 1 | 3 |
| Comparative Example 4 | 0.050 | 0.02 | 3.5 | 1 | 5 |
| Comparative Example 5 | 0.050 | 0.05 | 3.0 | 1 | 10 |
| Comparative Example 6 | 0.050 | 0.02 | 5.6 | 7 | 15 |

Comparing the results of Examples 1 to 12 with the results of Comparative Examples 1 to 4, it was found that when the intensity of the X-ray diffraction line corresponding to the (200) plane of the tantalum carbide coated film is larger than the intensities of the X-ray diffraction lines corresponding to the other crystal planes and the intensity ratio is 60% or more with respect to the sum of the intensities of the X-ray diffraction lines corresponding to all the crystal planes, the product life of the tantalum carbide coated carbon material is prolonged.

It was found from the results of Examples 1 to 5 that the intensity of the X-ray diffraction line corresponding to the (200) plane of the tantalum carbide coated film was 60% or more with respect to the sum of the intensities of the X-ray diffraction lines corresponding to all the crystal planes by setting the arithmetic mean roughness Ra of the surface of the carbon base material 4 to be 4.0 μm or less, and thus the product life of the tantalum carbide coated carbon material could be prolonged.

On the other hand, it was found from the results of Examples 1 to 5 that when the arithmetic mean roughness Ra of the surface of the carbon base material 4 was increased, the peeling strength between the carbon base material 4 and the tantalum carbide coated film was also increased. When the peeling strength between the carbon base material 4 and the tantalum carbide coated film is less than 1 MPa, the coated film tends to peel off, which is not preferable for applying the tantalum carbide coated carbon material as the member for an apparatus for manufacturing a semiconductor single crystal. In order to set the peeling strength between the carbon base material 4 and the tantalum carbide coated film to be 1 MPa or more, the arithmetic mean roughness Ra of the surface of the carbon base material 4 is preferably 0.4 µm or more, and more preferably 0.8 µm or more.

From the results of Examples 6 to 9, it is preferable that the Ra of the tantalum carbide coated film is small in order to prolong the product life of the tantalum carbide coated carbon material used in the apparatus for manufacturing a semiconductor single crystal, and it is more preferable that Ra is 3.5 µm or less.

Comparing Comparative Example 1 with Comparative Example 2, it was found that even when the intensity of the X-ray diffraction line corresponding to the (200) plane of the tantalum carbide coated film is equal, the arithmetic mean roughness Ra of the tantalum carbide coated film becomes small by polishing the tantalum coated film or the like to prolong the product life.

Comparing Example 3 with Comparative Example 4, it was found that in the process of coating the tantalum carbide on the carbon base material 4, the intensity of the X-ray diffraction line corresponding to the (200) plane of the tantalum carbide crystal coated thereon becomes larger by setting the temperature in the reaction chamber 2 to be higher than 1000° C. and thus the product life was prolonged. In addition, comparing Example 17 with Comparative Example 5, it was found that when the flow ratio of methane to tantalum pentachloride is increased to 20 times, if the temperature in the reaction chamber 2 is 850° C. or higher, the peak intensity of the (200) plane becomes large. On the other hand, when the reaction temperature is too high, the crystal system of the tantalum carbide is changed to an acicular crystal and the peak intensity of the (200) plane is decreased, so the reaction temperature is preferably set to be 1200° C. or lower. From the above results, it was found that the temperature is set to be 850° C. or higher and 1200° C. or lower in order to improve the product life of the tantalum carbide coated carbon material.

Comparing Example 11 with Comparative Example 4, it is found that in the process of annealing the carbon base material 4 coated with the tantalum carbide, the intensity of the X-ray diffraction line corresponding to the (200) plane of the tantalum carbide crystal is increased by setting the temperature of the annealing processing to be 2500° C. to prolong the product life.

From the above results, it was found that the temperature of the annealing processing is set to be 2500° C. in order to improve the product life of the tantalum carbide coated carbon material.

Comparing Example 3 with Comparative Example 3, it was found that when the ratio of tantalum pentachloride occupied in the raw material gas is small, the peak intensity of the (200) plane tends to be decreased, and the flow ratio of methane and tantalum pentachloride in the raw material gas ($CH_4/TaCl_5$) is set to be about 5. In addition, from the results of Examples 13 to 19 and Comparative Example 6, it was found that the flow ratio ($CH_4/TaCl_5$) of methane and tantalum pentachloride in the raw material gas is set to be 2 or more and 20 or less.

It should be noted that the present invention is not limited to the above embodiment. The above-described embodiment is an example and has substantially the same constitution as the technical idea described in the claims of the present invention, and any embodiment exerting the same action effect is included in the technical scope of the present invention.

What is claimed is:

1. A member for an apparatus for manufacturing a semiconductor single crystal, said member comprising a tantalum carbide coated carbon material in which at least a part of a surface of a carbon base material is coated with a tantalum carbide coated film containing tantalum carbide as a main component, wherein
in the tantalum carbide coated film, intensity of an X-ray diffraction line corresponding to a (200) plane with respect to an out-of-plane direction is larger than the intensity of the X-ray diffraction line corresponding to other crystal planes, and the intensity ratio is 60% or more with respect to a sum of intensities of X-ray diffraction lines corresponding to all crystal planes, and
an arithmetic mean roughness Ra of a surface of the tantalum carbide coated film is 3.5 µm or less.

2. The member for an apparatus for manufacturing a semiconductor single crystal according to claim 1, wherein the member for an apparatus for manufacturing a semiconductor single crystal is used in an apparatus for manufacturing a SiC single crystal.

3. The member for an apparatus for manufacturing a semiconductor single crystal according to claim 2, wherein the member for an apparatus for manufacturing a semiconductor single crystal is a crucible or a guide member used in an apparatus for manufacturing a SiC single crystal by a sublimation recrystallization method.

4. The member for an apparatus for manufacturing a semiconductor single crystal according to claim 2, wherein the member for an apparatus for manufacturing a semiconductor single crystal is a susceptor or an inner wall member used in an apparatus for manufacturing a SiC single crystal by epitaxially growing the SiC single crystal by a chemical vapor deposition method.

5. The member for an apparatus for manufacturing a semiconductor single crystal according to claim 1, wherein the member for an apparatus for manufacturing a semiconductor single crystal has two or more locations where a concentration of tantalum atom is low on the surface of the tantalum carbide coated film.

* * * * *